(12) United States Patent
Gutierrez

(10) Patent No.: US 7,145,903 B2
(45) Date of Patent: Dec. 5, 2006

(54) MULTI-MASTER BUS ARCHITECTURE FOR SYSTEM-ON-CHIP DESIGNS

(75) Inventor: Philip Gutierrez, Orlando, FL (US)

(73) Assignee: MeshNetworks, Inc., Maitland, FL (US)

( * ) Notice: Subject to any disclaimer, the term of this patent is extended or adjusted under 35 U.S.C. 154(b) by 1223 days.

(21) Appl. No.: 09/948,159

(22) Filed: Sep. 6, 2001

(65) Prior Publication Data

US 2003/0043790 A1    Mar. 6, 2003

(51) Int. Cl.
*H04L 12/50*    (2006.01)
(52) U.S. Cl. .................... 370/362; 370/535; 710/110
(58) Field of Classification Search ............ 370/351, 370/359, 362, 364, 365, 532, 537, 540; 710/100, 710/110, 113, 240, 241, 242, 305, 306, 309, 710/313
See application file for complete search history.

(56) References Cited

U.S. PATENT DOCUMENTS

| | | | |
|---|---|---|---|
| 4,494,192 A | 1/1985 | Lew et al. | |
| 4,617,656 A | 10/1986 | Kobayashi et al. | 370/74 |
| 4,736,371 A | 4/1988 | Tejima et al. | 370/95 |
| 4,742,357 A | 5/1988 | Rackley | 342/457 |
| 4,747,130 A | 5/1988 | Ho | 379/269 |
| 4,910,521 A | 3/1990 | Mellon | 342/45 |
| 5,034,961 A | 7/1991 | Adams | 375/130 |
| 5,068,916 A | 11/1991 | Harrison et al. | 455/39 |
| 5,231,634 A | 7/1993 | Giles et al. | 370/95.1 |
| 5,233,604 A | 8/1993 | Ahmadi et al. | 370/60 |
| 5,241,542 A | 8/1993 | Natarajan et al. | 370/95.3 |
| 5,317,566 A | 5/1994 | Joshi | 370/60 |
| 5,392,450 A | 2/1995 | Nossen | 455/12.1 |
| 5,412,654 A | 5/1995 | Perkins | 370/94.1 |
| 5,424,747 A | 6/1995 | Chazelas | 342/70 |
| 5,502,722 A | 3/1996 | Fulghum | 370/69.1 |
| 5,517,491 A | 5/1996 | Nanni et al. | 370/29 |
| 5,555,425 A | 9/1996 | Zeller et al. | |
| 5,555,540 A | 9/1996 | Radke | |
| 5,572,528 A | 11/1996 | Shuen | 370/85.13 |
| 5,615,212 A | 3/1997 | Ruszczyk et al. | 370/433 |

(Continued)

FOREIGN PATENT DOCUMENTS

CA    2132180    3/1996

(Continued)

OTHER PUBLICATIONS

Buerkle, Wolfgang and Trefz, Manfred; "On-Board Switching Architectures for Multimedia Satellite Systems"; Backnang, Germany, Space Communications 17; 2001.

(Continued)

*Primary Examiner*—Phirin Sam
(74) *Attorney, Agent, or Firm*—Randi L. Karpinia; Joseph J. Buczynski

(57) ABSTRACT

A bus architecture system to provide concurrency, fabricated on an integrated circuit for a system on chip design, for connecting a plurality of bus masters to a plurality of bus slaves. The system includes a plurality of multiplexers in communication with each data in port of each bus master and each bus slave. The system also includes a plurality of isolated data paths connecting the port out of each bus master to each multiplexer in communication with each data in port of each bus slave, and a plurality of isolated data paths connecting the port out of each bus slave to each multiplexer in communication with each data in port of each bus master, thereby providing concurrency on the system on chip design. In addition a distributed arbitration is included to allow each bus slave to be selected independently of the other bus slaves.

8 Claims, 5 Drawing Sheets

U.S. PATENT DOCUMENTS

| | | | |
|---|---|---|---|
| 5,618,045 A | 4/1997 | Kagan et al. | 463/40 |
| 5,621,732 A | 4/1997 | Osawa | 370/79 |
| 5,623,495 A | 4/1997 | Eng et al. | 370/397 |
| 5,627,976 A | 5/1997 | McFarland et al. | |
| 5,631,897 A | 5/1997 | Pacheco et al. | 370/237 |
| 5,644,576 A | 7/1997 | Bauchot et al. | 370/437 |
| 5,652,751 A | 7/1997 | Sharony | 370/227 |
| 5,680,392 A | 10/1997 | Semaan | 370/261 |
| 5,684,794 A | 11/1997 | Lopez et al. | 370/337 |
| 5,687,194 A | 11/1997 | Paneth et al. | 375/283 |
| 5,696,903 A | 12/1997 | Mahany | 395/200.58 |
| 5,701,294 A | 12/1997 | Ward et al. | 370/252 |
| 5,706,428 A | 1/1998 | Boer et al. | 395/200 |
| 5,717,689 A | 2/1998 | Ayanoglu | 370/349 |
| 5,745,483 A | 4/1998 | Nakagawa et al. | 370/335 |
| 5,774,876 A | 6/1998 | Wooley et al. | 705/28 |
| 5,781,540 A | 7/1998 | Malcolm et al. | 370/321 |
| 5,787,080 A | 7/1998 | Hulyalkar et al. | 370/348 |
| 5,794,154 A | 8/1998 | Bar-On et al. | 455/509 |
| 5,796,732 A | 8/1998 | Mazzola et al. | |
| 5,796,741 A | 8/1998 | Saito et al. | 370/439 |
| 5,805,593 A | 9/1998 | Busche | 370/396 |
| 5,805,842 A | 9/1998 | Nagaraj et al. | |
| 5,805,977 A | 9/1998 | Hill et al. | 455/31.3 |
| 5,809,518 A | 9/1998 | Lee | |
| 5,822,309 A | 10/1998 | Ayanoglu et al. | 370/315 |
| 5,844,905 A | 12/1998 | McKay et al. | 370/443 |
| 5,845,097 A | 12/1998 | Kang et al. | |
| 5,857,084 A | 1/1999 | Klein | |
| 5,870,350 A | 2/1999 | Bertin et al. | |
| 5,877,724 A | 3/1999 | Davis | 342/357 |
| 5,881,095 A | 3/1999 | Cadd | 375/202 |
| 5,881,372 A | 3/1999 | Kruys | 455/113 |
| 5,886,992 A | 3/1999 | Raatikainen et al. | 370/410 |
| 5,896,561 A | 4/1999 | Schrader et al. | 455/67.1 |
| 5,903,559 A | 5/1999 | Acharya et al. | 370/355 |
| 5,909,651 A | 6/1999 | Chander et al. | 455/466 |
| 5,936,953 A | 8/1999 | Simmons | 370/364 |
| 5,943,322 A | 8/1999 | Mayor et al. | 370/280 |
| 5,987,011 A | 11/1999 | Toh | 370/331 |
| 5,987,033 A | 11/1999 | Boer et al. | 370/445 |
| 5,991,279 A | 11/1999 | Haugli et al. | 370/311 |
| 6,028,853 A | 2/2000 | Haartsen | 370/338 |
| 6,029,217 A | 2/2000 | Arimilli et al. | |
| 6,034,542 A | 3/2000 | Ridgeway | |
| 6,044,062 A | 3/2000 | Brownrigg et al. | 370/238 |
| 6,047,330 A | 4/2000 | Stracke, Jr. | 709/238 |
| 6,052,594 A | 4/2000 | Chuang et al. | 455/450 |
| 6,052,752 A | 4/2000 | Kwon | |
| 6,064,626 A | 5/2000 | Stevens | |
| 6,067,291 A | 5/2000 | Kamerman et al. | 370/338 |
| 6,067,297 A | 5/2000 | Beach | 370/389 |
| 6,078,566 A | 6/2000 | Kikinis | 370/286 |
| 6,104,712 A | 8/2000 | Robert et al. | 370/389 |
| 6,108,738 A | 8/2000 | Chambers et al. | |
| 6,115,580 A | 9/2000 | Chuprun et al. | 455/1 |
| 6,122,690 A * | 9/2000 | Nannetti et al. | 710/311 |
| 6,130,881 A | 10/2000 | Stiller et al. | 370/238 |
| 6,132,306 A | 10/2000 | Trompower | 453/11.1 |
| 6,163,699 A | 12/2000 | Naor et al. | 455/453 |
| 6,173,349 B1 * | 1/2001 | Qureshi et al. | 710/110 |
| 6,178,337 B1 | 1/2001 | Spartz et al. | 455/561 |
| 6,192,053 B1 | 2/2001 | Angelico et al. | 370/448 |
| 6,192,230 B1 | 2/2001 | Van Bokhorst et al. | 455/343 |
| 6,208,870 B1 | 3/2001 | Lorello et al. | 455/466 |
| 6,222,463 B1 | 4/2001 | Rai | 340/928 |
| 6,223,240 B1 | 4/2001 | Odenwald et al. | |
| 6,240,294 B1 | 5/2001 | Hamilton et al. | 455/456 |
| 6,243,769 B1 * | 6/2001 | Rooney | 710/56 |
| 6,246,875 B1 | 6/2001 | Seazholtz et al. | 455/432 |
| 6,249,516 B1 | 6/2001 | Brownrigg et al. | 370/338 |
| 6,275,707 B1 | 8/2001 | Reed et al. | 455/456 |
| 6,285,892 B1 | 9/2001 | Hulyalkar | 455/574 |
| 6,304,556 B1 | 10/2001 | Haas | 370/254 |
| 6,327,300 B1 | 12/2001 | Souissi et al. | 375/219 |
| 6,349,091 B1 | 2/2002 | Li | 370/238 |
| 6,349,210 B1 | 2/2002 | Li | 455/450 |
| 6,359,872 B1 | 3/2002 | Mahany et al. | 370/338 |
| 6,581,124 B1 * | 6/2003 | Anand | 710/305 |
| 6,587,905 B1 * | 7/2003 | Correale et al. | 710/107 |
| 6,691,193 B1 * | 2/2004 | Wang et al. | 710/200 |
| 6,778,526 B1 * | 8/2004 | Brown et al. | 370/351 |
| 6,981,077 B1 * | 12/2005 | Modelski et al. | 710/100 |
| 7,076,595 B1 * | 7/2006 | Dao et al. | 710/317 |
| 2001/0053699 A1 | 12/2001 | McCrady et al. | 455/513 |
| 2002/0126660 A1 * | 9/2002 | Watanabe et al. | 370/364 |

FOREIGN PATENT DOCUMENTS

| | | |
|---|---|---|
| EP | 0513841 A2 | 11/1992 |
| EP | 0627827 A2 | 12/1994 |
| EP | 0924890 A2 | 6/1999 |
| FR | 2683326 | 7/1993 |
| WO | WO 9608884 | 3/1996 |
| WO | WO 9724005 | 7/1997 |
| WO | WO 9839936 | 9/1998 |
| WO | WO 9912302 | 3/1999 |
| WO | WO 0034932 | 6/2000 |
| WO | WO 0110154 | 2/2001 |
| WO | WO 01/35210 | 5/2001 |
| WO | WO 0133770 | 5/2001 |
| WO | WO 0135567 | 5/2001 |
| WO | WO 0137481 | 5/2001 |
| WO | WO 0137482 | 5/2001 |
| WO | WO 0137483 | 5/2001 |
| WO | WO 0235253 | 5/2002 |

OTHER PUBLICATIONS

Wong et al., "Soft Handoffs in CDMA Mobile Systems", Dec. 1997, IEEE Personal Communications.

Wong et al., "A Pattern Recognition System for Handoff Algorithms", Jul. 2000, IEEE Journal on Selected Areas in Communications, vol. 18, No. 7.

Andras G. Valko, "Cellular IP: A New Approach to Internet Host Mobility", Jan. 1999, ACM Computer Communication Review.

Richard North, Dale Bryan and Dennis Baker, "Wireless Networked Radios: Comparison of Military, Commerical, and R&D Protocols", Feb. 28-Mar. 3, 1999, 2nd Annual UCSD Conference on Wireless Communications, San Diego CA.

Benjamin B. Peterson, Chris Kmiecik, Richard Hartnett, Patrick M. Thompson, Jose Mendoza and Hung Nguyen, "Spread Spectrum Indoor Geolocation", Aug. 1998, Navigation: Journal of the Institute of Navigation, vol. 45, No. 2, summer 1998.

Josh Broch, David A. Maltz, David B. Johnson, Yih-Chun Hu and Jorjeta Jetcheva, "A Performance Comparison of Multi-Hop Wireless Ad Hoc Network Routing Protocols", Oct. 25-30, 1998, Proceedings of the 4th Annual ACM/IEEE International Conference on Mobile Computing and Networking.

C. David Young, "USAP: A Unifying Dynamic Distributed Multichannel TDMA Slot Assignment Protocol".

Chip Elliot and Bob Heile, "Self-Organizing, Sef-Healing Wireless Networks", 2000 IEEE.

J.J. Garcia-Luna-Aceves and Asimakis Tzamaloukas, "Reversing the Collision-Avoidance Handshake in Wireless Networks".

J.J Garcia-Luna-Aceves and Marcelo Spohn, "Transmission-Efficient Routing in Wireless Networks Using Link-State Information".

J.J. Garcia-Luna-Aceves and Ewerton L. Madruga, "The Core-Assisted Mesh Protocol", Aug. 1999, IEEE Journal on Selected Areas in Communications, vol. 17, No. 8.

Ad Kamerman and Guido Aben, "Net Throughput with IEEE 802.11 Wireless LANs".

J.R. McChesney and R.J. Saulitis, "Optimization of an Adaptive Link Control Protocol for Multimedia Packet Radio Networks".

Ram Ramanathan and Regina Rosales-Hain, "Topology Control of Multihop Wireless Networks using Transmit Power Adjustment".

Ram Ramanathan and Martha E. Steenstrup, "Hierarchically-Organized, Multihop Mobile Wireless Networks for Quality-of-Service Support".

Zhenyu Tang and J.J. Garcia-Luna-Aceves, "Collision-Avoidance Transmission Scheduling for Ad-Hoc Networks".

George Vardakas and Wendell Kishaba, "QoS Networking With Adaptive Link Control and Tactical Multi-Channel Software Radios".

* cited by examiner

MULTI-MASTER BUS ARCHITECTURE FOR SYSTEM-ON-CHIP DESIGNS

FIELD OF THE INVENTION

The present invention is directed to multi-master bus architecture for system-on-chip designs to provide high-performance interconnect standards for communications between devices and modules commonly found in highly integrated system-on-chip designs.

BACKGROUND OF THE INVENTION

Generally, a system-on-chip (SoC) design must include an embedded processor core, memory and a sufficient number of peripheral devices so that the embedded processor may perform most of its functions without leaving the chip. In the past this required sophisticated proprietary bus architectures to connect the various devices together. Other more traditional bus architectures, for example, multi-master bus architectures with bi-directional busses are individually designed for the specific system algorithm or application specific integrated circuit (ASIC). However, such bus architectures do not support concurrency and as such a subsequent transaction or transfer must wait for an existing transaction or transfer to complete.

While many systems handle concurrency, there is still a need for improvements. For example, International Application published under the Patent Cooperation Treaty, Publication Number WO 01/35210 describes a bus architecture method for a communication processor. While the bus architecture disclosed in WO 01/35210 supports non blocking or concurrency operations, the system uses a shared bus arbitration scheme or a centralized arbitration scheme. Such system designs desire improvements in order to increase scalability. The WO 01/35210 application in most likelihood also uses a centralized address decoding scheme that also desires improvements.

SUMMARY OF THE INVENTION

The present invention eliminates the need of bridges and bus-segmentation by providing multiple point-to-point connections between all bus agents. This allows any bus master to communicate with any bus slave. Such multiple point-to-point connections may result in the either fully connected or partially connected buses. The proposed bus architecture has been defined to satisfy several key requirements.

It is an objective of the present invention to facilitate right-first-time development of advanced designs with multiple central processing units (CPUs), signal processors and other complex functions required by SoC designs.

It is an objective of the present invention to be technology-independent and provide high reusability of system functions across a wide range of technological processes.

It is a further objective of the present invention to encourage modular design and the use of a core based methodology that will provide processor independence, allowing easy migration to faster processors, and encourage the development of reusable peripheral devices.

It is yet a further objective of the present invention to provide a high-performance bus, capable of supporting multiple bus-masters and direct memory access (DMA) burst transfers, while maintaining a simple interface that can be used by slower peripheral devices and control registers.

It is yet another objective of the present invention to provide a high degree of concurrency or non-blocking between multiple maser-slave connections allowing DMA transfers to occur simultaneously with other data transfers, such as CPU instruction fetches, thereby avoiding bottlenecks that normally exist on shared bus architectures.

The combination of these objectives makes the present invention suitable for any general purpose SoC design. In particular, the high degree of concurrency and the possibility of high data throughput rates make the present invention suitable for high performance applications such as video and imaging applications, disk storage applications, or graphic controllers. Peak burst rates may exceed 1 Gbyte/s with aggregate system throughput rates in excess of 10 Gbytes/s.

Numerous other advantages and features of the invention will become readily apparent from the following detailed description of the invention and the embodiments thereof, from the claims, and from the accompanying drawings.

BRIEF DESCRIPTION OF THE DRAWINGS

A fuller understanding of the foregoing may be had by reference to the accompanying drawings, wherein.

DETAILED DESCRIPTION OF THE INVENTION

Figure 1:
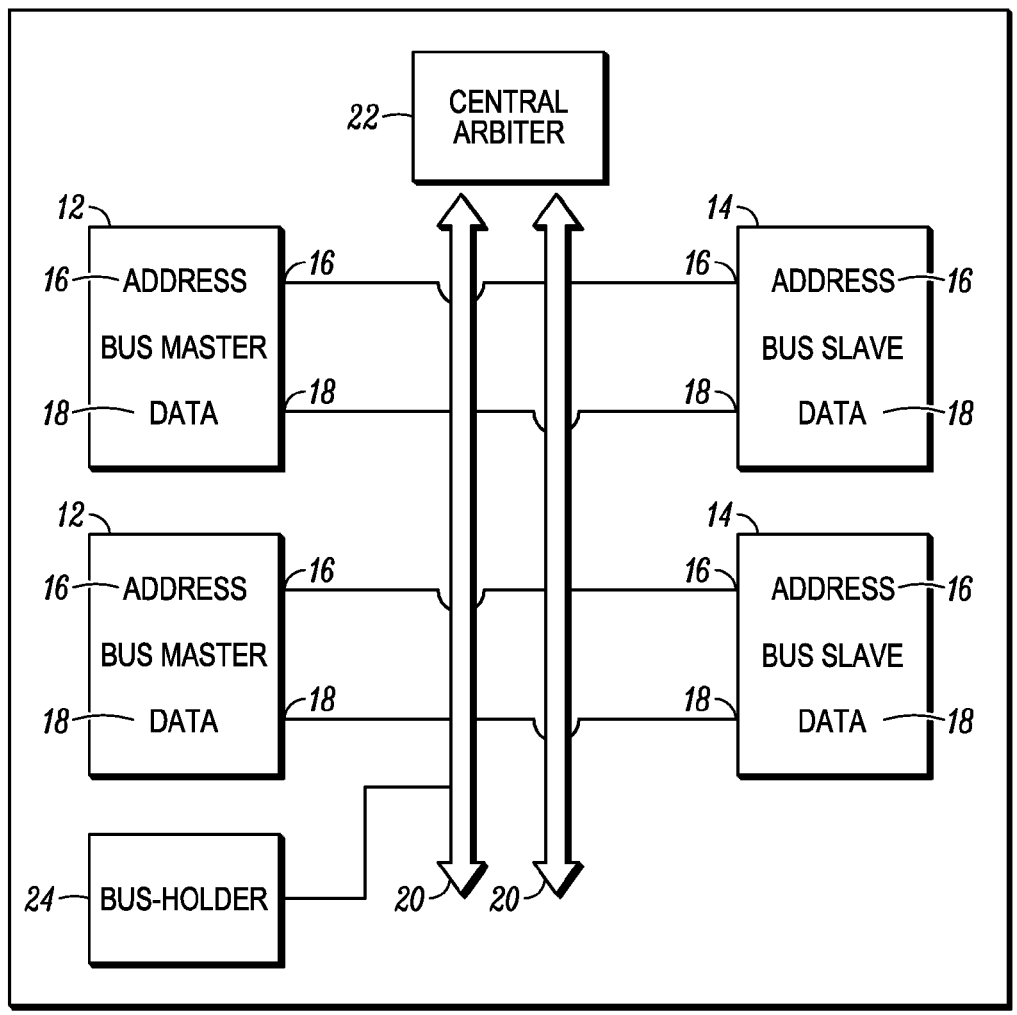
FIG. 1 is a block diagram illustrating a traditional multi-master bus architecture using bi-directional busses.

While the invention is susceptible to embodiments in many different forms, there are shown in the drawings and will be described herein, in detail, the preferred embodiments of the present invention. It should be understood, however, that the present disclosure is to be considered an exemplification of the principles of the invention and is not intended to limit the spirit or scope of the invention and/or claims of the embodiments illustrated. It will also be apparent to one skilled in the art that the present invention may be practiced without the specific details. In other instances, well-known features are omitted or simplified in order not to obscure the present invention.

Referring now to prior art FIG. 1, in accordance with the prior art a traditional multi-master bus system using bi-directional busses is illustrated. The multi-master bus system utilizes a plurality of bus masters 12 in communication with a plurality of bus slaves 14. Each bus master and bus slave includes an address port 16, which transfers information about where the data should go, and a data port 18 to transfer and receive the data. The multi-master bus system includes bi-directional busses 20 interconnecting the bus maters 12 and bus slaves 14. Connected to the bi-directional busses 20 is an arbiter 22 that evaluates the pending requests for access to the bi-directional busses 20 and grants the access to a bus master 12 based on a system-specific algorithm. In addition, a bus holder 24 may be further attached to the bi-directional busses 20 to maintain a logic state on the bi-directional busses 20, when the bi-directional busses are not being driven. However, the use of bi-directional busses complicates application specific integrated circuits (ASIC) because of well-known synthesis and static timing analysis problems. Moreover, in smaller technology geometries wire delays begin to dominate the performance of the bi-directional busses.

Figure 2:
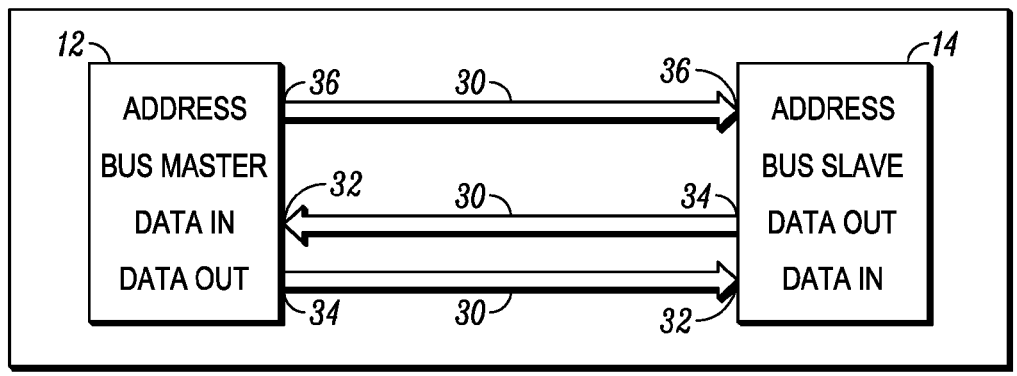
FIG. 2 is a block diagram illustrating bus agents connected by uni-directional busses in accordance with the prior art.

Referring now to prior art FIG. 2, in order to simplify the static timing and synthesis process to meet overall timing requirements the use of uni-directional busses are employed. As illustrated, each bus master 12 is in communication with a bus slave 14 through unidirectional busses 30. This requires the bus master 12 and the bus slave 14 to have a data in port 32 and a data out port 34 as well as an address port 36. The lack of bus-holders aides in the static timing and synthesis analysis. Furthermore, a multiplexed address/data out port, discussed in greater detail below, may be employed in order to mitigate the routing resources required and, thereby, allow more freedom during cell placement.

In yet another means to simplify the synthesis process, static timing and formal verification, a single clock edge may be used to control all bus operations.

In another prior art scheme the use of point-to-point multiplexed bus schemes is employed to increase the data throughput. Data originating at each bus master is multiplexed through a multiplexer (MUX) to provide a single data bus that terminates at a bus slave. Likewise, data originating at each slave is multiplexed (through a MUX) to provide a single data bus that terminates at a bus master. This provides a point-to-point connection between each bus master and each slave. These point-to-point connections allow for concurrent or non-blocking data transfers between independent master-slave pairs providing an aggregate data throughput of the bus which is much greater then the throughput of any given master-slave pair.

Figure 3:
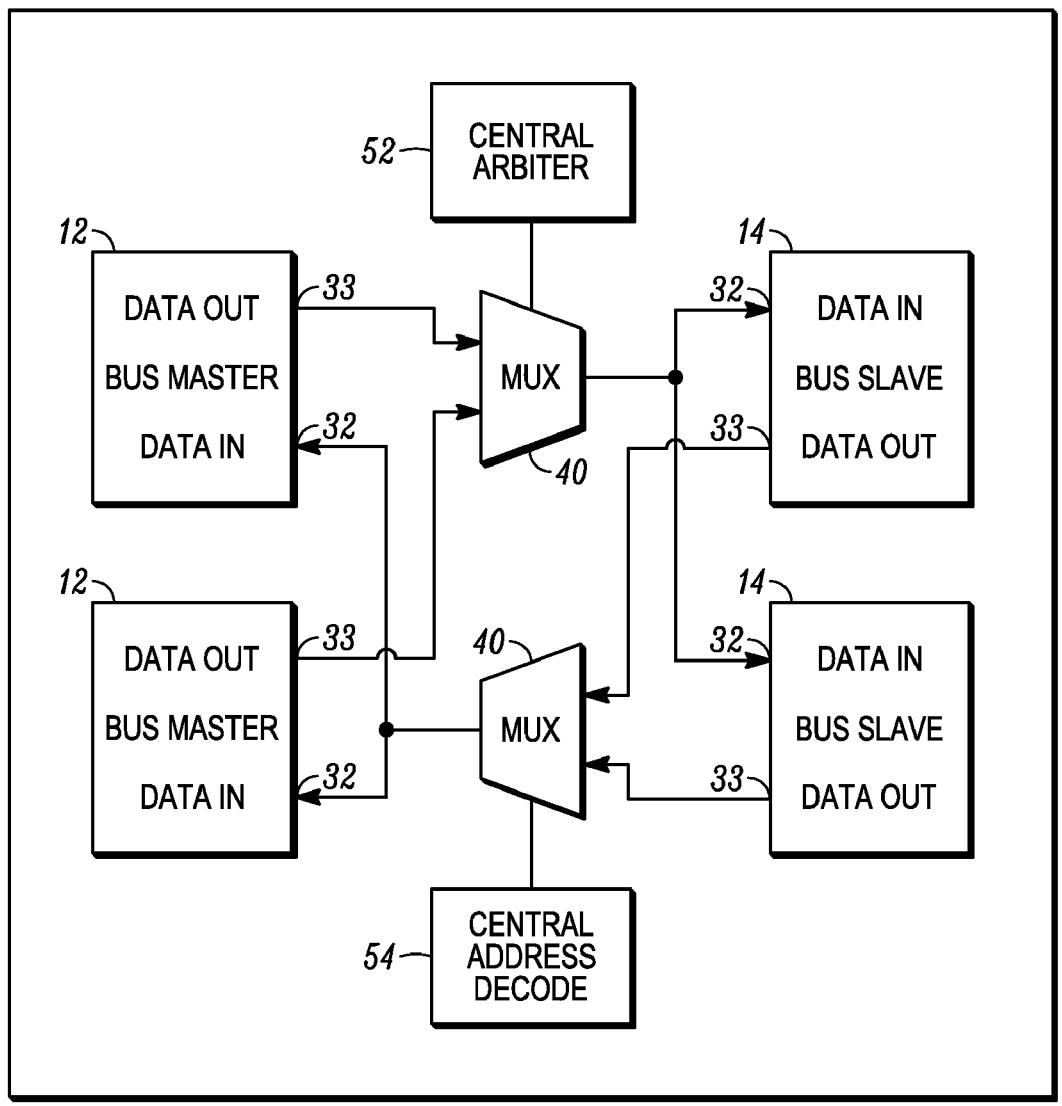
FIG. 3 is a block diagram illustrating a centrally multiplexed multi-master bus architecture in accordance with the prior art.

Referring now to prior art FIG. 3, a centrally multiplexed bus scheme is illustrated. The centrally multiplexed bus scheme includes a plurality of bus masters 12, each of which include a data in port 32 and a multiplexed data out/address port 33. The write data originating at each bus master 12 is multiplexed through a MUX 40 to provide a single bus 50 that terminates at all of the bus slaves 14. Similarly, the read data originating at each bus slave 14 is multiplexed to provide a single bus 50 that terminates at all of the bus masters 12. A central arbiter 52 and a central address decoder 54 allows a single data transfer at any given time, such that while this scheme reduces the amount of logic, it allows only a single data transfer at any given time.

Figure 4:
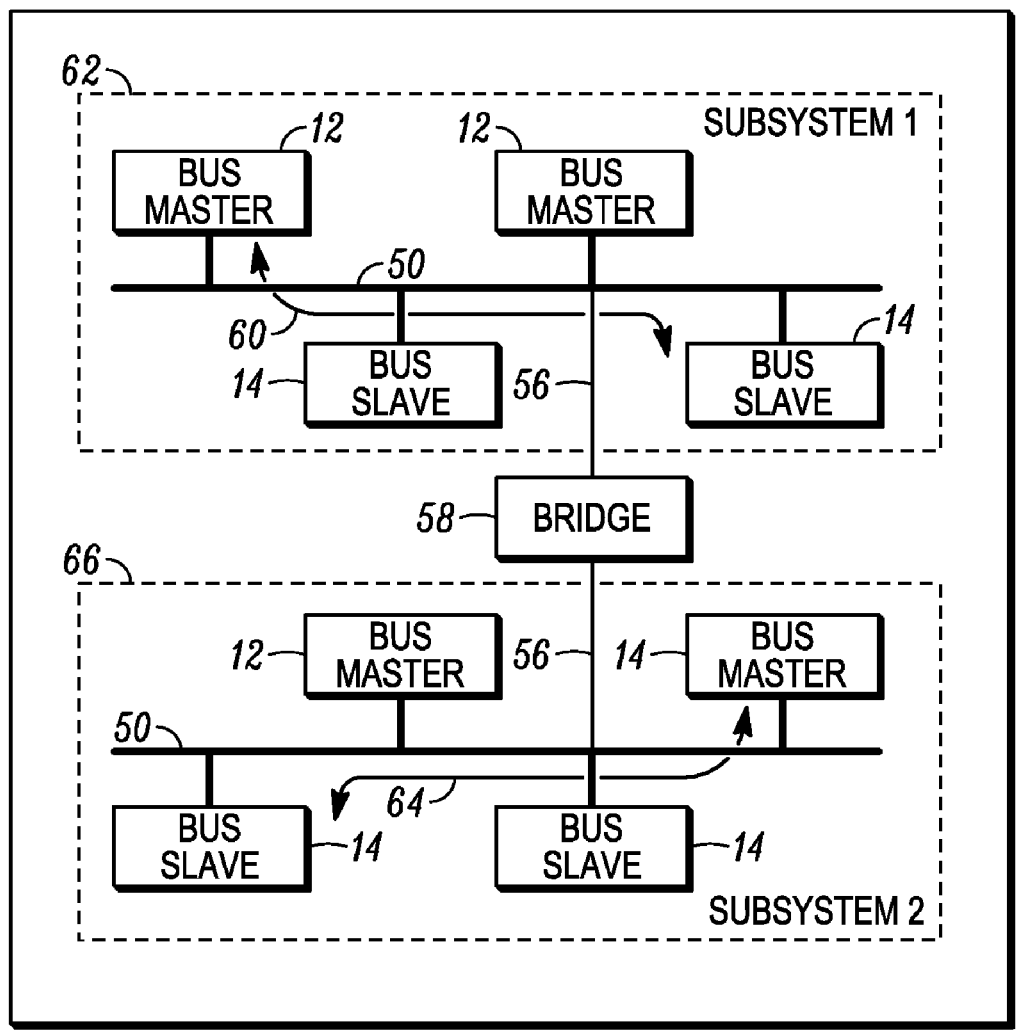
FIG. 4 is a block diagram illustrating the concurrency in a typical systems across multiple subsystems connected by a bridge in accordance with the prior art.

Referring now to prior art FIG. 4, the centrally multiplexed bus scheme further provides concurrency by splitting the bus 50 into isolated bus segments 56, and connecting these bus segments 56 by means of a bridge 58. Although the bridge allows concurrent operations at a system level, any given bus segment 56 is limited to a single operation at any given time. As illustrated each subsystem is permitted a single transfer at a time, shown by operation line 60 in a first subsystem 62 and operation line 64 in a second subsystem 66.

Figure 5:
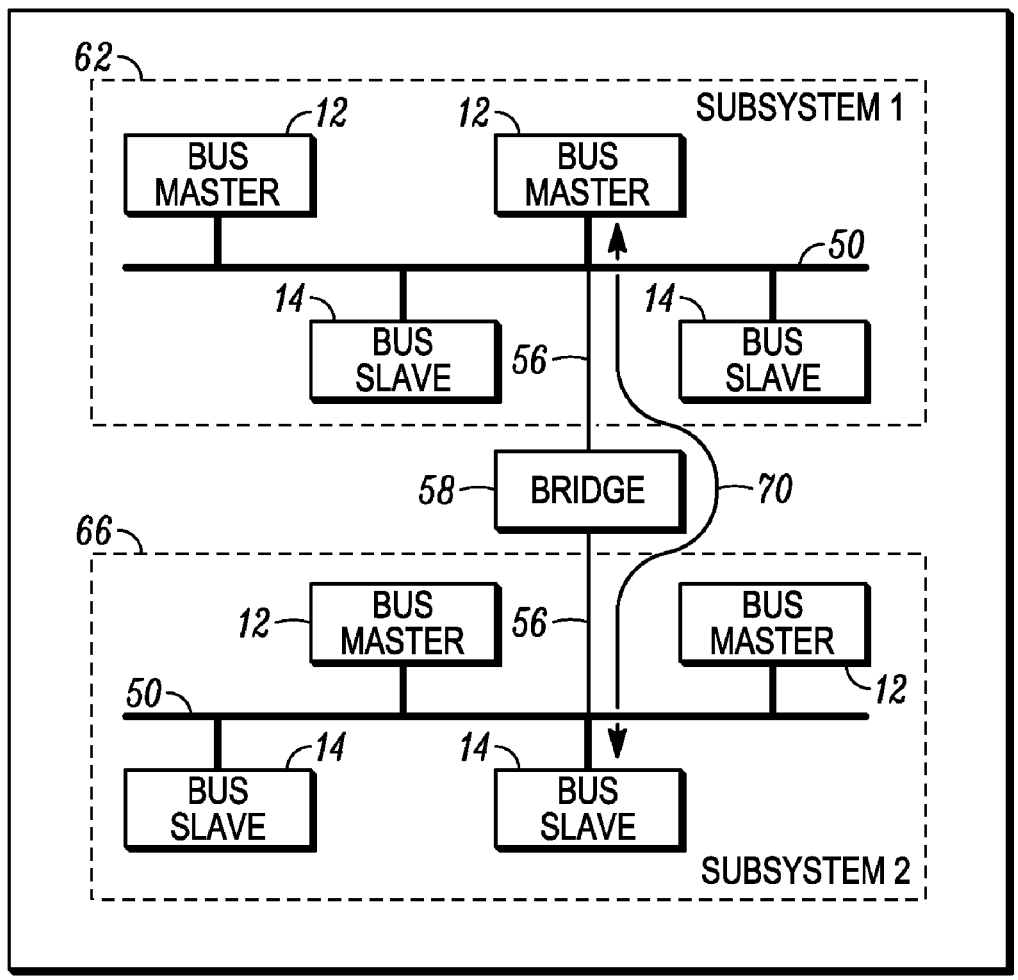
FIG. 5 is a block diagram illustrating an inter-system transfer in a typical concurrent system across a bridge in accordance with the prior art.

Moreover, systems providing concurrency by splitting the bus into multiple segments incur performance penalties when crossing subsystems boundaries, illustrated in prior art FIG. 5. The master-slave pair involved in the cross-system transaction will prevent any intra-system master-slave pair to communicate. Hence, concurrency is lost on those two bus segments. If a transaction is required to traverse multiple bus segments, concurrency is lost on all those bus segments, and, if not properly partitioned, severe system performance penalties may result.

As illustrated by operation line 70, a bus master 12 in the first subsystem 62 is in communication with a bus slave 14 on the second subsystem 66. When the master-slave connection is requested across the two subsystems, the bridge 58 is used to connect the two subsystems to create a single system. All transfers between any master-slave pair in a subsystem is suspended until the current cross-system transfer is complete.

Figure 6:
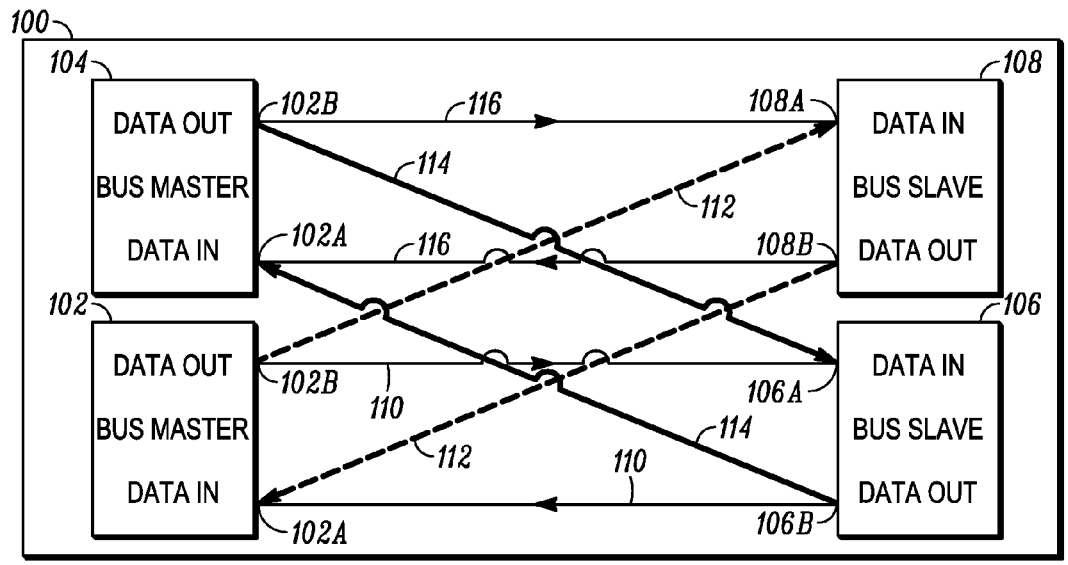
FIG. 6 is a block diagram in accordance with the present invention illustrating a fully-connected bus architecture showing the isolated data paths in order to provide concurrent data transfers.

The present invention eliminates the need of bridges and bus-segmentation by providing multiple point-to-point connections between all bus agents. Referring now to FIG. 6, a bus architecture 100 in accordance with the present invention is illustrated. The bus architecture 100 includes a plurality of bus masters, sequentially numerated as a first bus master 102 and a second bus master 104, and a plurality of bus slaves, sequentially numerated as a first bus slave 106 and a second bus slave 108. It should be further noted that the present bus architecture 100 only illustrates two bus masters and two bus slaves for simplicity purposes only, and that more bus masters and bus slaves may be employed in either the same or uneven numbers in the overall system-on-chip design. In addition thereto, the numerology used herein to distinguish between multiple bus masters or bus slaves, i.e. first bus master, second bus master and first bus slave and second bus slave, does not unnecessarily denote an association between a first bus master and a first bus slave.

Continuing to refer to FIG. 6, each bus master 102 and 104 includes a data in port 102*a* and 104*a* and a data out/address port 104*b* and 104*b*, respectively. Similarly, each bus slave 106 and 108 includes a data in/address port 106*a* and 108*a* and a data out port 106*b* and 108*b*, respectively. Moreover, each bus master 102 and 104 is fully connected to each bus slave and each bus slave 106 and 108 is fully connected to each bus master. More specifically, the first bus master 102 is connected to the first bus slave 106 by uni-directional data paths 110, which connects the data out/address port 104*b* of the first bus master 102 to the data in/address port 106*a* of the first bus slave 106 and connects the data out port 106*b* of the first bus slave 106 to the data in port 102*a* of the first bus master 102. The first bus master 102 is also connected to the second bus slave 108, through similarly means along unidirectional data paths 112. The second bus master 104 is similarly connected to the first bus slave by uni-directional data paths 114 and connected to the second bus slave by uni-directional data paths 116. This allows any bus master 102 or 104 to communicate with any bus slave 106 or 108. In addition thereto, the unidirectional links 112 through 116 are isolated such that concurrent data transfers are permitted.

Although the fully connected bus architecture 100 may be more gate intensive, typical systems do not require full connectivity, for example a direct memory access (DMA) bus master does not need to access configuration registers. As such, a partially connected bus has connections between legal connections only, so redundant paths exist only between bus agents that require concurrent operations. The larger gate count incurred when using a fully connected bus architecture is thereby mitigated by the use of a partially connected bus.

Figure 7:
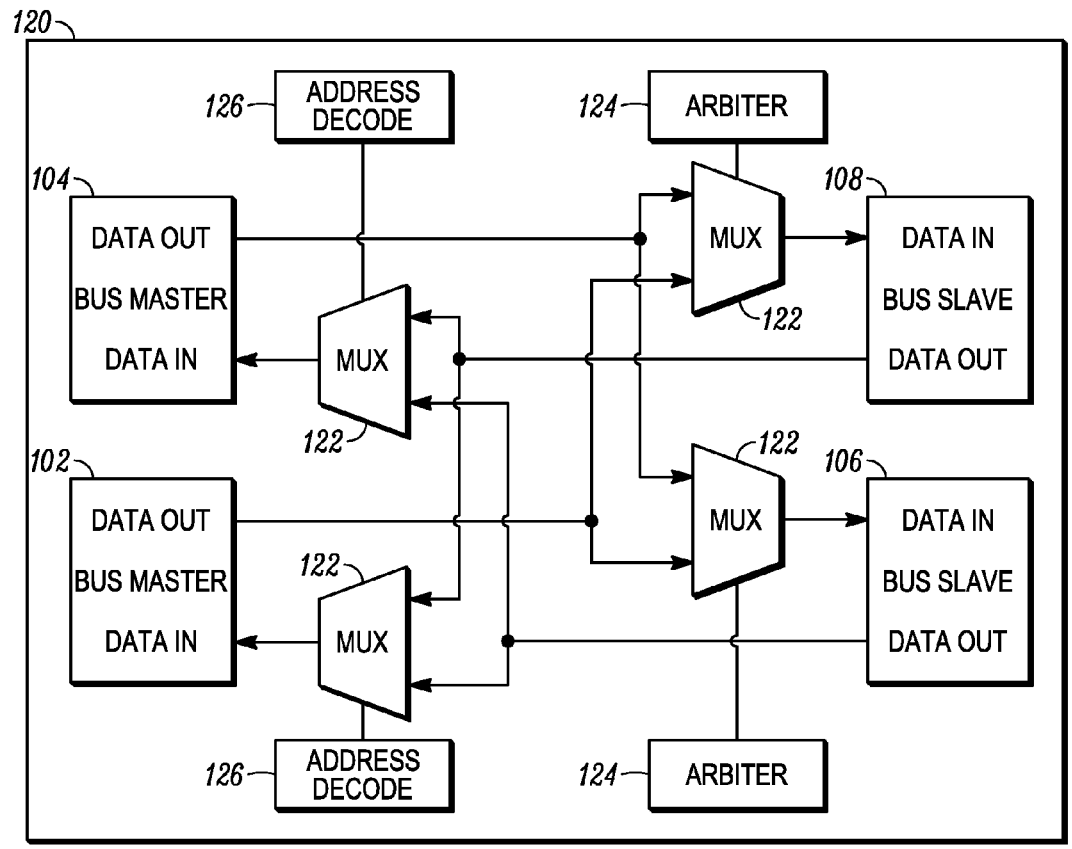
FIG. 7 is a block diagram in accordance with the present invention illustrating a bus architecture with the use of both a distributed arbitration scheme and a decentralized address decoding scheme.

Referring now to FIG. 7, in accordance with the present invention a distributed arbitration scheme and a distributed address decoding scheme for a bus architecture scheme 120 is illustrated. The bus architecture scheme 120 includes a plurality of bus masters, 102 and 104, as well as a plurality of bus slaves, 106 and 108. Each bus master 102 and 104 and each bus slave 106 and 108 is associated with a multiplexer 122 allowing each bus master to be in communication with each bus slave and visa versa. Corresponding to each multiplexer 122 that is associated with the bus slaves 106 and 108, is an arbiter 124. As such a bus master 102 or 104 would request access to the bus slave 106 or 108 rather than to the bus. If the bus slave is available, access may be granted and the data transfer may commence. This permits concurrency since the transfer may commence while an existing data transfer between two different bus agents is occurring. In contrast, in the centrally multiplexed bus scheme, illustrated in FIG. 3, only a single data transfer may occur at any given time, so a bus-master requests access to the bus rather than to the bus slave.

Moreover, as opposed to a shared bus arbitration scheme, a distributed arbitration scheme allows each slave to have a tailored arbitration scheme. For example purposes only, a system with a microprocessor control unit (MCU) and a digit signal processor (DSP) may share a common memory through an equal priority fair scheme. Whereas the DSP may also have priority to fast program memory for code execution. The two arbiters for the two different memories can thus impose different arbitration schemes.

In addition thereto, each multiplexer 122 that is associated with a bus master 102 and 104 is associated with an address decoder 126. The address decoder effectively defines an address map for that particular master. It also ensures that any access initiated by the bus master falls within a valid address range for that bus master. This provides a level security by physically denying unauthorized bus masters access to selective slaves. Each address decoder 126 defines an address map for that particular bus master and any bus slave may be mapped to a location suitable for that bus master. That is, a bus slave may be located at different addresses for different bus masters. This simplifies integration of multi-CPU systems where addressable address regions for different CPUs may not overlap and where access to a shared slave is desired.

It should be further noted that while the present embodiment illustrates a bus architecture utilizing both the distributed arbitration scheme and the decentralized address decoding scheme, the present invention may employ either scheme with or without the other to meet specific predefined needs.

The bus architecture in accordance with the present invention is extremely flexible and is scalable in size and performance. The present invention supports any number of bus masters and any number of bus slaves either of which may or may not be on or off chip. The present invention is limited only by the physical limitations imposed by the specific semiconductor technology used. With small geometry processes used today, these limitations pose no practical limits on the size of the bus. The present invention also scales with performance needs. The use of a single clock throughout the system allows for higher throughput to be achieved by simply increasing the clock rate. In addition, the width of any bus can be set to support 8-, 16-, 32-, 64-, or 128-bit bus widths. In fact, there are no particular limitations on the bus width. The combination of a wide data bus width and a high clock rate can yield data burst rates in excess of 1.6 Gbytes/s per point-to-point connection and aggregate rates in excess of 10 Gbytes/s.

The present invention also supports various protocols. For example, the present invention supports a retry condition. If a bus master is granted access to a slave that is busy performing a background task, and therefore, unable to service the bus master, the bus slave may signal a retry condition. This allows intelligent masters to relinquish control of the slave and initiate new requests to other slave devices. Moreover, since multiple concurrent connections between the bus master and bus slaves exist there is no need for split transactions. A bus slave with a long latency access would therefore not need to free up the bus to allow other bus masters access to other slaves.

The present invention supports data pre-fetch capabilities. Intelligent bus slaves with long latency requirements may pre-fetch a large amount of data before presenting it to the requesting bus master. This increases data throughput by providing optimized bus utilization and minimizing protocol overhead.

The present invention supports address and data error recovery protocols. A bus master will receive an address error if it attempts to access an address outside of its predefined address range. The bus slave may signal a data error to indicate a bad data transfer. Both conditions will allow a bus master to relinquish control of the bus slave without affecting other bus agents and system reliability.

The use of a distributed arbitration scheme, as mentioned above, allows individual arbitrations units to be optimized for specific bus slaves. For example, an arbiter to a memory controller bus slave may assign a higher priority level to a CPU bus master than to a DMA bus master to ensure that the CPU may keep its instruction pipe full. Any given arbiter may be optimized to support a variety of arbitration schemes tailored for the specific bus slave. For example, a fair arbitration scheme may be required for a particular bus slave while a different bus slave may require a hybrid scheme providing multiple priority levels with fairness imposed within the priority group.

In addition thereto, the present invention supports maximum latency timers limiting the time any bus master may occupy a bus slave. This provides the basic flow control needed to prevent bus masters from being starved.

Furthermore, the present invention may also support other well-known protocols without deviating from the spirit or scope of the present invention.

From the foregoing and as mentioned above, it will be observed that numerous variations and modifications may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

The invention claimed is:

1. A bus architecture system on an integrated circuit comprising:
   a plurality of pairs of data ports, each pair of data ports defines a data in port and a data out port, and each pairs of data ports correspond to a either a bus master or a bus slave;
   a plurality of multiplexers in communication with each data in port;
   a plurality of isolated data paths connecting the data out port corresponding to a bus master to each multiplexer, of said plurality of multiplexers, in communication with a data in port corresponding to a bus slave, and a plurality of isolated data paths connecting the data out port corresponding to a bus slave to each multiplexer, of said plurality of multiplexers, in communication with a data in port corresponding to a bus master, thereby providing concurrency on the system on chip design;

an arbiter in communication with each multiplexer that is in communication with a data in port corresponding to a bus slave; and an address decoder in communication with each multiplexer that is in communication with a data in port corresponding to a bus master.

2. The bus architecture system of claim 1 further comprising at least one of the following protocols: retry condition, data pre-fetch, address and data error recovery, or maximum latency timers.

3. The bus architecture system of claim 1, wherein one or more of the bus masters are off chip.

4. The bus architecture system of claim 1, wherein one or more of the bus slaves are off chip.

5. A bus architecture system on an integrated circuit comprising: a plurality of pairs of data ports, each pair of data ports defines a data in port and a data out port, and each pairs of data ports correspond to a either a bus master or a bus slave; a plurality of multiplexers in communication with each data in port; a plurality of isolated data paths connecting the data out port corresponding to a bus master to each multiplexer, of said plurality of multiplexers, in communication with a data in port corresponding to a bus slave, and a plurality of isolated data paths connecting the data out port corresponding to a bus slave to each multiplexer, of said plurality of multiplexers, in communication with a data in port corresponding to a bus master, thereby providing concurrency on the system on chip design; and an address decoder in communication with each multiplexer that is in communication with a data in port corresponding to a bus master.

6. The bus architecture system of claim 5 further comprising: an arbiter in communication with each multiplexer that is in communication with a data in port corresponding to a bus slave.

7. The bus architecture system of claim 1 or 6 further comprising a single clock controlling the bus architecture system to yield data burst rates greater than 1.6 Gbytes/s per point-to-point connection.

8. The bus architecture system of claim 1 or 6 further comprising a single clock controlling the bus architecture system to yield aggregate data burst rates greater than 10 Gbytes/s per point-to-point connection.

* * * * *